United States Patent
Rahman et al.

(10) Patent No.: US 7,701,251 B1
(45) Date of Patent: Apr. 20, 2010

(54) METHODS AND APPARATUS FOR IMPLEMENTING A STACKED MEMORY PROGRAMMABLE INTEGRATED CIRCUIT SYSTEM IN PACKAGE

(75) Inventors: Arifur Rahman, San Jose, CA (US); Chidamber R. Kulkarni, Hyderabad (IN)

(73) Assignee: XILINX, Inc., San Jose, CA (US)

( * ) Notice: Subject to any disclaimer, the term of this patent is extended or adjusted under 35 U.S.C. 154(b) by 75 days.

(21) Appl. No.: 12/043,843

(22) Filed: Mar. 6, 2008

(51) Int. Cl.
*H03K 19/177* (2006.01)
*H01L 25/00* (2006.01)
(52) U.S. Cl. .............................. 326/41; 326/40; 257/777
(58) Field of Classification Search ............. 326/38–41, 326/47; 257/686, 774, 777; 438/109, 667
See application file for complete search history.

(56) References Cited

U.S. PATENT DOCUMENTS

| | | | | |
|---|---|---|---|---|
| 5,793,115 A | * | 8/1998 | Zavracky et al. | 257/777 |
| 6,410,431 B2 | * | 6/2002 | Bertin et al. | 438/667 |
| 7,068,072 B2 | | 6/2006 | New et al. | |
| 2009/0045496 A1 | * | 2/2009 | Tian et al. | 257/686 |

OTHER PUBLICATIONS

U.S. Appl. No. 11/973,062 filed Oct. 4, 2007, Rahman, Arifur et al., entitled "Integrated Circuit with Through-Die Via Interface for Die Stacking", Xilinx, Inc. 2100 Logic Drive, San Jose, CA 95124.

\* cited by examiner

*Primary Examiner*—Daniel D Chang
(74) *Attorney, Agent, or Firm*—Robert M. Brush; Thomas George

(57) ABSTRACT

Methods and apparatus for implementing a stacked memory-programmable integrated circuit system-in-package are described. An aspect of the invention relates to a semiconductor device. A first integrated circuit (IC) die is provided having an array of tiles that form a programmable fabric of a programmable integrated circuit. A second IC die is stacked on the first IC die and connected therewith via inter-die connections. The second IC die includes banks of memory coupled to input/output (IO) data pins. The inter-die connections couple the IO data pins to the programmable fabric such that all of the banks of memory are accessible in parallel.

11 Claims, 4 Drawing Sheets

METHODS AND APPARATUS FOR IMPLEMENTING A STACKED MEMORY PROGRAMMABLE INTEGRATED CIRCUIT SYSTEM IN PACKAGE

FIELD OF THE INVENTION

One or more aspects of the present invention relate generally to semiconductor devices and, more particularly, to methods and apparatus for implementing a stacked memory-programmable integrated circuit system-in-package.

BACKGROUND

Programmable logic devices (PLDs) exist as a well-known type of programmable integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

As semiconductor technology has advanced, the amount and speed of logic available on an IC, such as an FPGA, has increased more rapidly than the number and performance of I/O connections. As a result, IC die stacking techniques have received renewed interest to address the interconnection bottleneck of high-performance systems. In stacked IC applications, two or more ICs are stacked vertically and interconnections are made between them. Such a stacked arrangement is referred to as a system-in-package (SIP).

SUMMARY

An aspect of the invention relates to a semiconductor device. A first integrated circuit (IC) die is provided having an array of tiles that form a programmable fabric of a programmable IC. A second IC die is stacked on the first IC die and connected therewith via inter-die connections. The second IC die includes banks of memory coupled to input/output (IO) data pins. The inter-die connections couple the IO data pins to the programmable fabric such that all of the banks of memory are accessible in parallel from the programmable fabric.

Another aspect of the invention relates to a method of implementing a system-in-package (SIP) having a memory IC stacked on a programmable IC and connected therewith via inter-die connections. Control signals are communicated between a programmable fabric of the programmable IC and the memory IC through the inter-die connections. Data signals are communicated between the programmable fabric and memory banks in the memory IC through the inter-die connections such that all of the memory banks are accessed in parallel responsive to the control signals.

Another aspect of the invention relates to a semiconductor device. A programmable IC having a programmable fabric is provided. A memory is stacked on the programmable IC and includes connections therewith. The memory includes banks coupled to input/output (IO) data pins. The connections couple the IO data pins to the programmable fabric such that all of the banks are accessible in parallel from the programmable fabric.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

One type of system-in-package (SIP) involves stacking a memory IC, such as a dynamic random access memory (DRAM), on a programmable IC (e.g., a PLD, such as an FPGA). A conventional DRAM includes memory banks, a column address decoder, a row address decoder, and control logic. The control logic orchestrates the data access (e.g., burst length, burst type, access mode, etc.), refresh sequence, and initialization. The data width of a conventional DRAM is limited by the availability of input/output (IO) pins of the DRAM IC package. As a result, all memory banks cannot be accessed in parallel. Thus, in a stacked IC application, the bandwidth between the programmable IC and a DRAM is limited. Accordingly, there exists a need in the art for methods and apparatus implementing a stacked memory-programmable IC SIP that exhibits improved bandwidth between the programmable IC and the memory.

Figure 1:
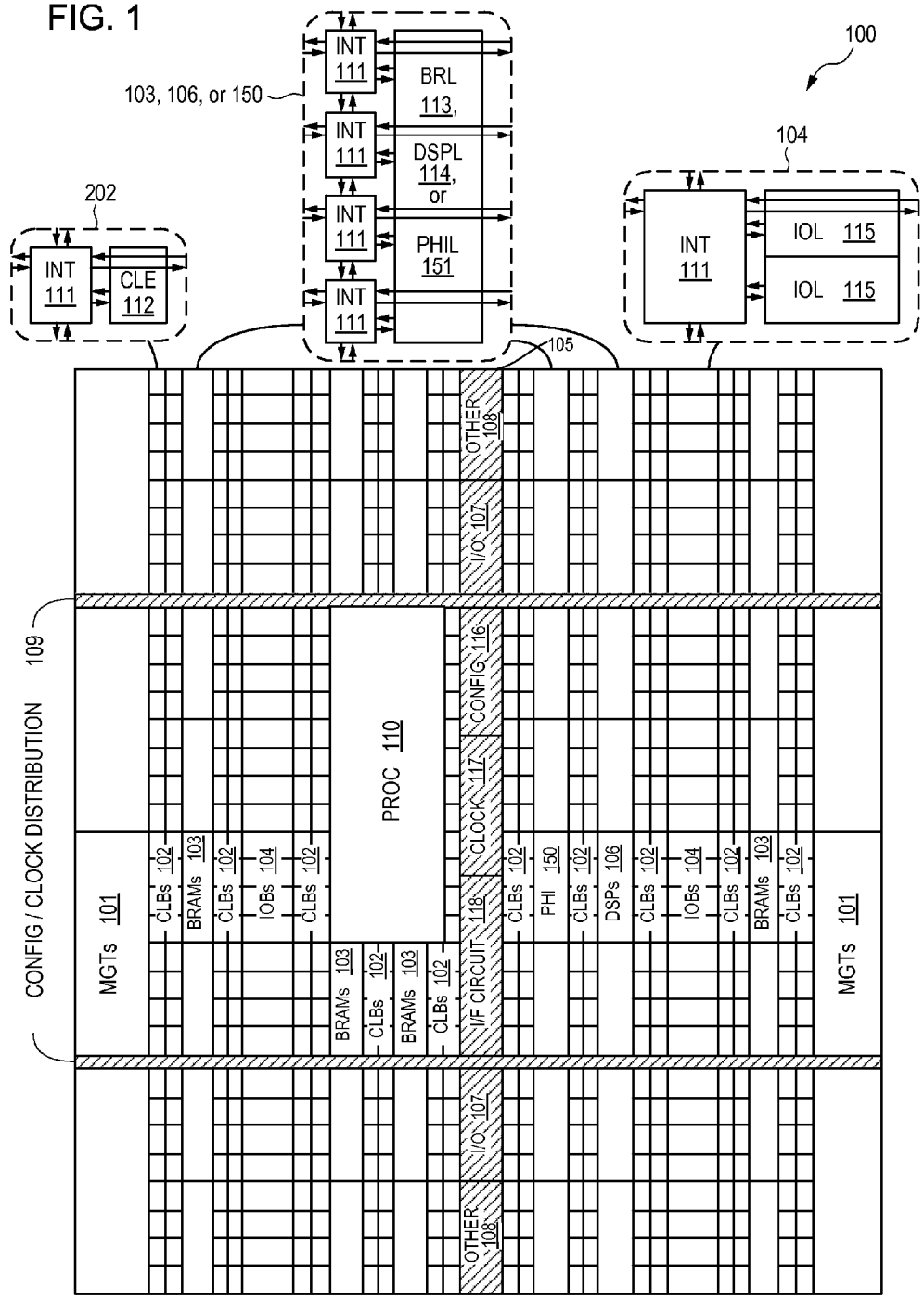
FIG. 1 is a block diagram depicting an exemplary embodiment of an FPGA in accordance with one or more aspects of the invention.

FIG. 1 is a block diagram depicting an exemplary embodiment of an FPGA 100 in accordance with one or more aspects of the invention. The FPGA 100 includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110). The FPGA 100 also includes one or more programmable heterogeneous integration (PHI) tiles 150. In some embodiments, the FPGA 100 includes a plurality of PHI tiles 150 arranged in a column. The PHI tiles 150 facilitate interconnection to one or more other ICs stacked on the backside of the die of the FPGA 100, such as one or more memory ICs. Exemplary embodiments of the PHI tiles 150 are discussed in detail below.

In some FPGAs, each programmable tile includes a programmable interconnect element (INT 111) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 111) also includes the connections to and from the programmable logic element within the same tile, as shown by the examples included at the top of FIG. 1. The programmable interconnect element (INT 111) may also include connections via routing conductor segments to and from a corresponding interconnect element that span multiple columns of logic. That is, routing conductor segments may span a plurality of tiles (e.g., a "hex" line spans six tiles).

For example, a CLB 102 can include a configurable logic element (CLE 112) that can be programmed to implement user logic, plus a single programmable interconnect element (INT 111). The CLE 112 includes one or more slices of logic (not shown). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements (e.g., four are shown). Similarly, a PHI tile 150 can include a PHI logic element (PHIL 151) in addition to an appropriate number of programmable interconnect elements (e.g., four are shown). An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs is typically included wherever the CLBs appear, to facilitate the efficient implementation of user logic. Examples of FPGAs that may be used with embodiments of the invention are the Virtex™4 and Virtex-5 FPGAs available from Xilinx, Inc., of San Jose, Calif.

Figure 2:
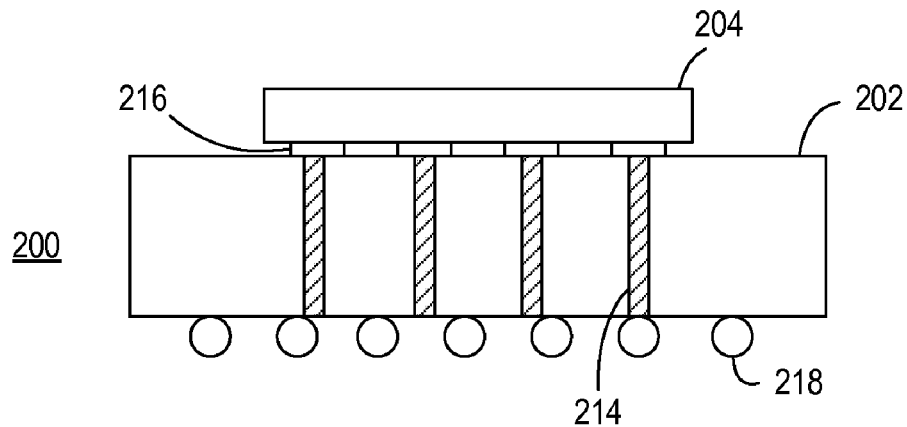
FIG. 2 is a cross-sectional view showing an exemplary embodiment of a semiconductor device in accordance with one or more aspects of the invention.

FIG. 2 is a cross-sectional view showing an exemplary embodiment of a semiconductor device 200 in accordance with one or more aspects of the invention. The semiconductor device 200 includes a programmable IC die 202 and a memory IC die 204. The programmable IC die 202 may be configured in accordance with the FPGA architecture 100 shown in FIG. 1, for example. The memory IC die 204 may comprise memory circuitry, such as a dynamic random access memory (DRAM). Exemplary embodiments of memory architectures for the memory IC die 204 are described below in conjunction with FIGS. 4 and 5. The memory IC die 204 is vertically stacked with the programmable IC die 202. Each of the die 202 and 204 is configured for face-down mounting in flip-chip fashion. The term "face side" denotes the side of a die that receives the bulk of semiconductor processing such that circuitry is fabricated on that face side of the die. The side of a die opposite the face side is referred to as the backside of the die. Thus, the face side of the memory IC die 204 is mounted to the backside of the programmable IC die 202. Although the die 202 and 204 are illustratively shown as being mounted face down, those skilled in the art will appreciate that the invention described herein may be used with other configurations, such as the memory IC being mounted face-up on the backside of the programmable lane, or face-up or face-down on the face side of the programmable IC die.

In particular, the memory IC die 204 includes circuitry formed on a semiconductor substrate. The programmable IC die 202 includes circuitry formed on a semiconductor substrate and conductive interconnect formed over the circuitry. The programmable IC die 202 also includes an array of bump contacts 218 formed on the face side for flip-chip mounting to a carrier. The programmable IC die 202 also includes through-die vias (TDVs) 214 and an array of contacts 216. The contacts 216 are formed on the backside of the programmable IC die 202. The memory IC die 204 is electrically and mechanically coupled to the contacts 216. The TDVs 214 electrically couple the conductive interconnect and circuitry of the programmable IC die 202 to the contacts 216. Thus, the contacts 216 and the TDVs 214 provide inter-die connections between interconnect/circuitry of the programmable IC die 202 and interconnect/circuitry of the memory IC die 204. Although a single memory IC die is shown, those skilled in the art will appreciate that more than one memory IC, of similar or different types, may be mounted to the programmable IC die 202 in a similar fashion. Thus, when the term "memory IC die" is used below, it is to be understood that a plurality of memory IC dice may also be employed.

Returning to FIG. 1, the FPGA architecture 100 includes multiple columns of logic, including CLB columns, DSP columns, BRAM columns, IOB columns, and the like. In the embodiment shown, the FPGA architecture 100 also includes a column of PHI tiles 150. Although only a single column of PHI tiles 150 is shown, it is to be understood that the FPGA architecture 100 may generally include one or more columns of PHI tiles 150. The PHI tile 150 generally includes circuitry and TDVs for effecting inter-die connections between the FPGA and one or more memory ICs stacked on the FPGA. Thus, a die including the FPGA architecture 100 provides one example of a programmable IC die that can be used in semiconductor device 200. It will be clear to those of skill in the art that other programmable IC dice can be used.

Figure 3:
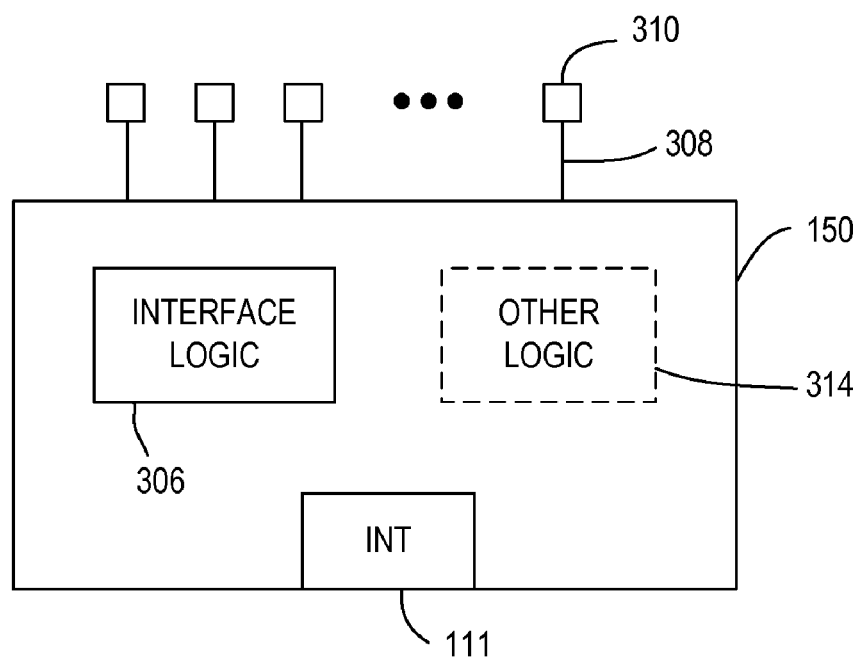
FIG. 3 is a block diagram depicting an exemplary embodiment of an interface tile in accordance with one or more aspects of the invention.

FIG. 3 is a block diagram depicting an exemplary embodiment of a PHI tile 150 in accordance with one or more aspects of the invention. The PHI tile 150 includes interface logic 306, programmable interconnect elements 111, TDVs 308, and pins 310. The pins 310 comprise (or are coupled to) the contacts 216 of the programmable IC die 202, which in this embodiment is an FPGA die. The TDVs 308 electrically couple the pins 310 to the interface logic 306. The interface logic 306 may include registers, three-state buffers, and the like for communicating signals between the FPGA die 202 and the memory IC die 204. The interface logic 306 may be coupled to the FPGA programmable interconnect via the programmable interconnect elements 111. For example, each of the programmable interconnect elements 111 may include programmable multiplexing structures that couple the PHI tile to the routing resource of the FPGA programmable interconnect. The PHI tile 150 may also include other logic 314, such as voltage level translation logic, test logic, configurable slice logic, and the like. For a more detailed description of an exemplary PHI tile 150 configuration, the reader is referred to commonly-assigned U.S. patent application Ser. No. 11/973,062, entitled "Integrated Circuit with Through-Die Via Interface for Die Stacking", filed Oct. 4, 2007, which is incorporated by reference herein in its entirety.

Figure 4:
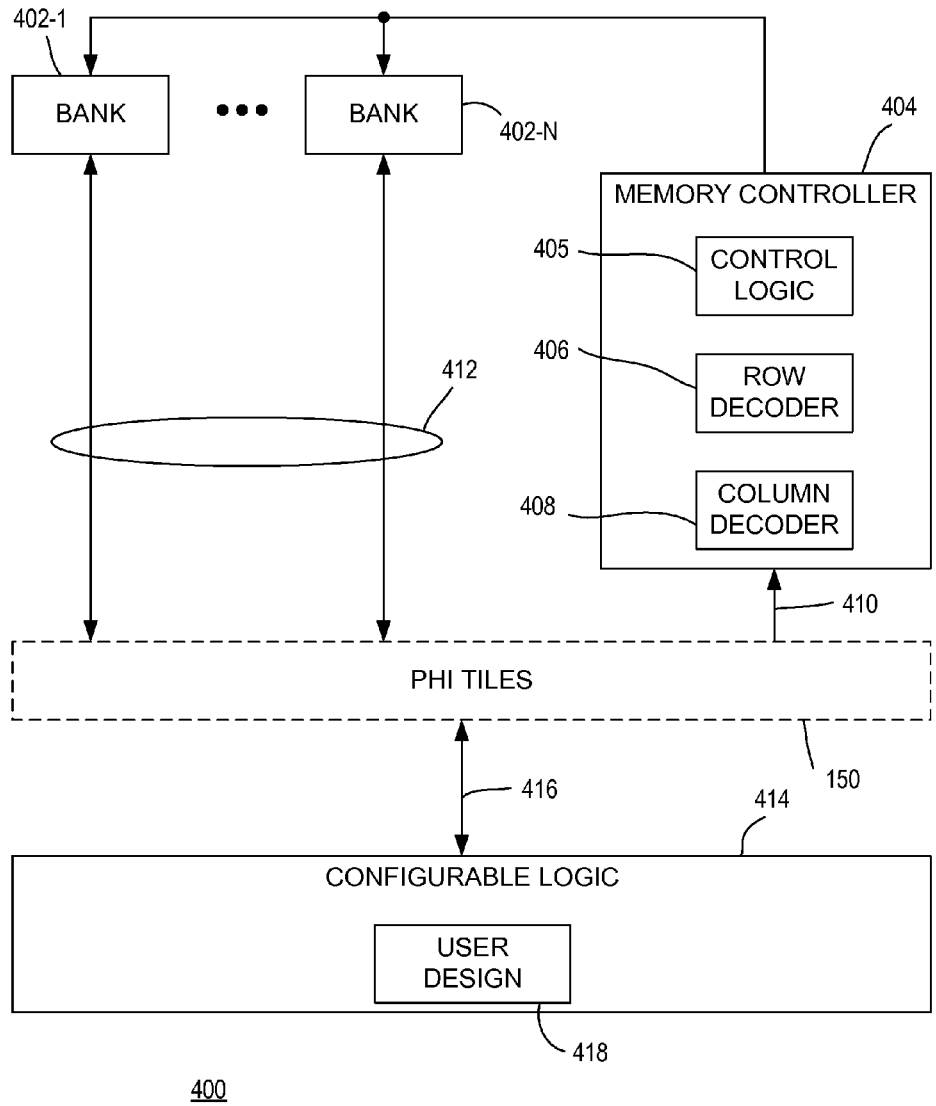
FIG. 4 is a block diagram depicting an exemplary embodiment of memory circuitry on a memory IC die stacked on a programmable IC die in accordance with one or more aspects of the invention.

FIG. 4 is a block diagram depicting an exemplary embodiment 400 of memory circuitry on the memory IC die 204 stacked on a programmable IC die, in accordance with one or more aspects of the invention. The memory circuitry includes a plurality of memory banks 402-1 through 402-N (collectively memory banks 402), where N is an integer greater than one. In the present embodiment, the memory banks 402 comprise banks of dynamic random access memory (DRAM). However, it will be clear to those of skill in the art that in other embodiments the memory banks may comprise banks of static random access memory (SRAM) or other types of memory. The memory circuitry further includes a memory controller 404 having control logic 405, a row decoder 406, and a column decoder 408. The row decoder 406 and the column decoder 408 are collectively referred to as decoder logic. The memory controller 404 is coupled to control pins 410 of the memory IC die 204. The control pins 410 are coupled to the contacts 216 of the programmable IC die 202. In the present example, the memory controller 402 is centralized, i.e., the memory controller 404 serves all of the memory banks 402. Accordingly, the control logic 405, the row decoder 406, and the column decoder 408 are each coupled to each of the memory banks 402. The memory banks 402 are coupled to IO pins 412 of the memory IC die 204. The IO pins 412 are coupled to the contacts 216 of the programmable IC die 202.

In one embodiment, the programmable IC die is an FPGA die, and the inter-die connections between the FPGA die 202 and the memory IC die 204 couple the IO data pins 412 and the control pins 410 to the programmable fabric of the FPGA die 202. For example, the IO data pins 412 and the control pins 410 are coupled to configurable logic 414 through routing resources 416. In some embodiments, the IO data pins 412 and the control pins 410 are coupled to one or more PHI tiles 150 on the FPGA die 202, which are in turn coupled to the routing resources 416. Notably, the inter-die connections couple the IO data pins 412 to the programmable fabric such that all of the memory banks 402 are accessible in parallel to the programmable fabric.

In this manner, a user design 418 configured in the configurable logic 414 is capable of accessing the memory circuitry on the memory IC die 204. For example, the user design 418 can send control signals to the control logic 405 to control data access mode, refresh sequence, initialization, and the like, of the memory banks 402. The user design 418 can send control signals to the row decoder 406 to activate one or more rows of memory cells across the memory banks 402 per read or write cycle. The user design 418 can send control signals to the column decoder 408 to select one or more sensed values in the activated row(s) of the memory cells per read or write cycle. Such operations with respect to DRAM are well known in the art.

Accordingly, the internal banking structure of the memory circuitry 402 is exposed to the programmable fabric of the programmable IC and, in turn, the user design 418. The user design 418 can thus access (read and write) all of the memory banks 402 in parallel. The inter-die connections between the memory IC die 204 and the programmable IC die 202 are capable of being numerous enough to create a high-density interface (e.g., greater than 1 terabit per second) between the memory circuitry and the programmable fabric. In some embodiments, the memory IC die 204 may include a plurality of memory circuits such as the one shown in FIG. 4.

Figure 5:
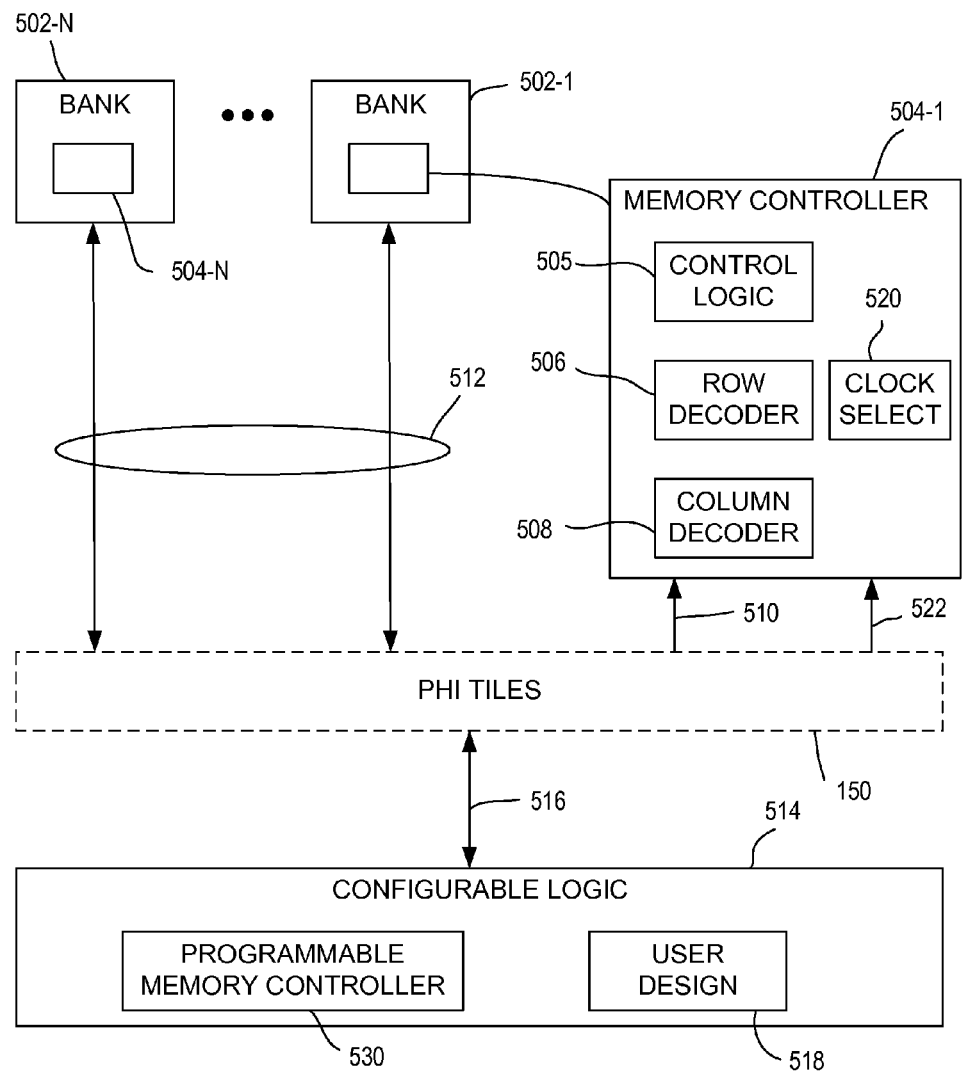
FIG. 5 is a block diagram depicting another exemplary embodiment of memory circuitry on a memory IC die stacked on a programmable IC die in accordance with one or more aspects of the invention.

FIG. 5 is a block diagram depicting another exemplary embodiment 500 of memory circuitry on the memory IC die 204 stacked on a programmable IC die 202, in accordance with one or more aspects of the invention. The memory circuitry includes a plurality of memory banks 502-1 through 502-N (collectively memory banks 502), where N is an integer greater than one. In the present embodiment, the memory banks 502 comprise banks of DRAM. However, it will be clear to those of skill in the art that in other embodiments the memory banks may comprise banks of static random access memory (SRAM) or other types of memory. Each of the memory banks 502 includes a respective one of a plurality of memory controllers 504-1 through 504-N (collectively memory controllers 504). For clarity, only the memory controller 504-1 of the memory bank 502-1 is shown in detail. It is to be understood that the memory controllers 504-2 through 504-N are configured similarly. Each of the memory controllers 504 includes control logic 505, a row decoder 506, and a column decoder 508. The row decoder 506 and the column decoder 508 are collectively referred to as decoder logic and are coupled to control a respective one of the memory banks 502. Each of the memory controllers 504 is coupled to control pins 510 of the memory IC die 204. The control pins 510 are coupled to the contacts 216 of the programmable IC die 202. In the present example, the memory controllers 504 are distributed, i.e., each of the banks 502 includes a dedicated memory controller. The memory banks 502 are coupled to IO pins 512 of the memory IC die 204. The IO pins 512 are coupled to the contacts 216 of the programmable IC die 202.

In one embodiment, the programmable IC die is an FPGA die, and the inter-die connections between the FPGA die 202 and the memory IC die 204 couple the IO data pins 512 and the control pins 510 to the programmable fabric of the FPGA die 202. For example, the IO data pins 512 and the control pins 510 are coupled to configurable logic 514 through routing resources 516. In some embodiments, the IO data pins 512 and the control pins 510 are coupled to one or more PHI tiles 150 on the FPGA die 202, which are in turn coupled to the routing resources 516. Notably, the inter-die connections couple the IO data pins 512 to the programmable fabric such that all of the memory banks 502 are accessible in parallel to the programmable fabric.

In this manner, a user design 518 configured in the configurable logic 514 is capable of accessing the memory circuitry on the memory IC die 204. In addition, each of the memory banks 502 is individually controllable. For example, the user design 518 can send control signals to the control logic 505 to control data access mode, refresh sequence, initialization, low power mode, or the like, on a bank-by-bank basis. Likewise, the user design 518 can send control signals to the row decoder 506 and column decoder 508 to read/write on a bank-by-bank basis.

In some embodiments, each of the memory controllers 504 includes clock selection logic 520. The clock selection logic 520 is configured to drive the respective memory controller and memory bank with a selected clock signal. The clock selection logic 520 is coupled to clock pins 522 of the memory IC die 204. The clock pins 522 are coupled to the contacts 216 of the programmable IC die 202. The inter-die connections between the programmable IC die 202 and the memory IC die 204 couple the clock pins 522 to clock resources in the programmable fabric of the programmable IC die 202. The clock resources may be configured to supply different clock signals. Accordingly, the clock selection logic 520 in each of the memory controllers 504 can select from a plurality of available clock signals provided by the programmable IC die 502. As such, each of the memory banks 502 may use the same or a different clock as any other of the memory banks 502.

In some embodiments, the memory banks 402 each have identical width and identical depth. Likewise, in some embodiments, the memory banks 502 each have identical width and identical depth. In some cases, a programmable IC-memory SIP may be configured to support a wide range of applications, and thus it may be desirable to incorporate an assortment of memory bank types. Thus, in some embodiments, the memory IC die 204 may include multiple memory circuits, each having different types of memory banks. For example, a memory type may be defined by memory organization (e.g., width and depth) and/or memory access pattern (e.g., interleaved access versus non-interleaved). Likewise, in some embodiments, the memory banks 502 may be of different memory types.

Returning to FIG. 5, in some embodiments, a programmable memory controller 530 is implemented in the programmable fabric of the programmable IC. For example, the programmable memory controller 530 may be configured in the configurable logic 514 or may comprise dedicated logic in the programmable IC. The programmable memory controller 530 includes control pins coupled to the control pins 510 of the memory IC die 204 through the inter-die connections. The programmable memory controller 530 is capable of programmably configuring the memory banks 502, e.g., to customize the organization and/or the access pattern. For example, the programmable memory controller 530 can configure an arrangement of the memory banks 502 to provide a customized memory width and/or depth in accordance with the needs of the user design 518. The programmable memory controller 530 can configure an arrangement of the memory banks 502 to provide a customized memory with interleaved access among banks. In some embodiments, a plurality of programmable memory controllers 520 may be included in the programmable IC fabric resulting in a plurality of customized memory arrangements that can be used by the user design 518.

Methods and apparatus for implementing a stacked memory-programmable logic device system-in-package have been described. In some embodiments, the internal banking structure of a custom memory IC is exposed to the programmable IC fabric through inter-die connections. The inter-die connections may be high-density connections, such that a high-density interface between the memory and the programmable IC is achieved. The inter-die connections couple the IO data pins to the programmable fabric such that all of the banks of memory are accessible in parallel from the programmable fabric. In some embodiments, each of the memory banks can be accessed and controlled independently of other memory banks. In some embodiments, the programmable clock network of the programmable IC is made available to the stacked memory, such that each memory bank can operate at a different clock frequency. In some embodiments, multiple memory banks may be grouped together to create a deeper and/or wider memory or to provide for interleaved data access. In some embodiments, each of the memory banks includes (or is coupled to) a separate memory controller. In other embodiments, a central memory controller is coupled to a plurality of the memory banks. In some embodiments, the programmable fabric of the programmable IC may be configured to implement a programmable memory controller to control the grouping or memory banks to vary organization or access patterns. It will be apparent to one skilled in the art after reading this specification that the present invention can be practiced within these and other architectural variations.

Further, the present invention has been found to be particularly applicable and beneficial for programmable logic devices (PLDs). Hence, an appreciation of the present invention is presented by way of specific examples utilizing PLDs such as field programmable gate arrays (FPGAs). However, the present invention is not limited by these examples, and can be applied to other programmable integrated circuits, including integrated circuits that are only partially programmable.

An additional benefit of the stacked programmable IC-memory SIP described above is that the signaling protocols between the programmable IC and the memory (via the control signals) can be simplified. There is no need for source-synchronous IO or additional timing overhead for interfacing the memory and the programmable IC. The distributed memory banks can be treated as an embedded intellectual property (IP) core. The memory banks can be clocked synchronously using clock resources available in the programmable fabric of the programmable IC. The delay from the memory pins to the locations of interest in the programmable fabric (e.g., interface tiles) can be made available in a speed file. Programmable IC place-and-route (PAR) tools can use such a speed file to meet overall timing requirements of a user design.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A semiconductor device, comprising:
a first integrated circuit (IC) die having an array of tiles forming a programmable fabric; and
a second IC die stacked on the first IC die and connected therewith via inter-die connections, the second IC die including banks of memory coupled to input/output (IO) data pins, the inter-die connections coupling the IO data pins to the programmable fabric such that all of the banks of memory are accessible in parallel from the programmable fabric,
wherein the second IC die includes a central memory controller having control pins coupled to control resources and decoder resources, the control resources and decoder resources each coupled to each of the banks of memory, the inter-die connections coupling the control pins to the programmable fabric, or wherein each of the banks of memory includes a memory controller having the control pins coupled to the control resources and the decoder resources, the inter-die connections coupling the control pins to the programmable fabric, or wherein the first IC die includes a memory controller having the control pins coupled to the control resources and the decoder resources, the inter-die connections coupling the control pins to at least a portion of the banks of memory on the second IC die.

2. The semiconductor device of claim 1, wherein the memory controller in each of the banks of memory includes clock selection logic, the inter-die connections coupling the clock selection logic to clock resources in the programmable fabric.

3. The semiconductor device of claim 1, wherein each of the banks of memory is one of a plurality of memory types, the plurality of memory types being defined by at least one of different access patterns or different organizations.

4. The semiconductor device of claim 1, wherein the memory controller of the first IC die is configured in the programmable fabric.

5. A method of implementing a system-in-package (SIP) having a memory integrated circuit (IC) stacked on a programmable IC and connected therewith via inter-die connections, the method comprising:

communicating control signals between a programmable fabric of the programmable IC and the memory IC through the inter-die connections; and communicating data signals between the programmable fabric and memory banks in the memory IC through the inter-die connections such that all of the memory banks are accessed in parallel responsive to the control signals, wherein communicating the control signals comprises: sending the control signals from the programmable fabric to a central memory controller in the memory IC, the control signals driving control resources and decoder resources each coupled to each of the memory banks, or wherein communicating the control signals comprises: sending the control signals from the programmable fabric to memory controllers distributed among the memory banks, the control signals driving the control resources and the decoder resources in each of the memory controllers, or wherein communicating the control signals comprises: sending the control signals from a memory controller configured in the programmable fabric to at least a portion of the memory banks.

6. The method of claim 5, further comprising:
coupling clock resources from the programmable fabric to clock selection logic in each of the memory controllers through the inter-die connections.

7. The method of claim 5, wherein each of the banks of memory is one of a plurality of memory types, the plurality of memory types being defined by at least one of different access patterns or different organizations.

8. The method of claim 5, wherein communicating the control signals further comprises:
establishing an arrangement of the memory banks having a selected memory organization and a selected memory access pattern.

9. A semiconductor device, comprising:
a programmable integrated circuit (IC) having a programmable fabric; and
a memory stacked on the programmable IC and having connections therewith, the memory including banks coupled to input/output (IO) data pins, the connections coupling the IO data pins to the programmable fabric such that all of the banks are accessible in parallel from the programmable fabric,
wherein the programmable IC includes a memory controller coupled to control pins and the banks via the connections, the memory controller being implemented using either dedicated resources or programmable resources in the programmable IC, or
wherein the memory includes a central memory controller coupled to control pins and the banks, the connections coupling the control pins to the programmable fabric, or
wherein each of the banks includes a memory controller coupled to control pins, the connections coupling the control pins to the programmable fabric.

10. The semiconductor device of claim 9, wherein the programmable IC comprises a field programmable gate array (FPGA).

11. The semiconductor device of claim 10, wherein the FPGA includes columns of tiles forming the programmable fabric, the tiles including interface tiles coupled to the connections between the memory and the programmable IC, the interface tiles further coupled to programmable routing in the programmable fabric.

* * * * *